US007471160B2

(12) United States Patent
Feng et al.

(10) Patent No.: US 7,471,160 B2
(45) Date of Patent: Dec. 30, 2008

(54) REAL-TIME FREQUENCY BAND SELECTION CIRCUIT FOR USE WITH A VOLTAGE CONTROLLED OSCILLATOR

(75) Inventors: Kai Di Feng, Hopewell Junction, NY (US); Anjali R. Malladi, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 11/618,952

(22) Filed: Jan. 2, 2007

(65) Prior Publication Data

US 2008/0157877 A1 Jul. 3, 2008

(51) Int. Cl.
*H03B 5/12* (2006.01)
*H03L 7/099* (2006.01)
(52) U.S. Cl. ............................. 331/17; 331/1 A; 331/8; 331/177 V; 331/179
(58) Field of Classification Search ................. 331/1 A, 331/8, 16–18, 25, 177 V, 179, DIG. 2
See application file for complete search history.

(56) References Cited

U.S. PATENT DOCUMENTS

| 4,206,420 | A | 6/1980 | Querry et al. |
| 5,648,744 | A | 7/1997 | Prakash et al. |
| 6,072,372 | A | 6/2000 | Yokoyama |
| 6,091,304 | A | 7/2000 | Harrer |
| 6,229,399 | B1 | 5/2001 | Tobise et al. |
| 6,259,327 | B1 | 7/2001 | Balistreri et al. |
| 6,686,804 | B1 | 2/2004 | Adams et al. |
| 6,753,738 | B1 * | 6/2004 | Baird .......................... 331/25 |
| 6,806,786 | B1 | 10/2004 | Lam et al. |
| 2002/0033741 | A1 | 3/2002 | Craninckx et al. |
| 2003/0050029 | A1 | 3/2003 | Kaufmann et al. |
| 2005/0237117 | A1 | 10/2005 | Vu et al. |
| 2007/0268084 | A1* | 11/2007 | Niwa .......................... 331/185 |

FOREIGN PATENT DOCUMENTS

EP        1060572 B1     1/2006

OTHER PUBLICATIONS

Dawn Wang, Xudong Wang, Aria Eshraghi, Danny Chang and Peter Bacon, "A Fully Integrated GSM/DCS/PCS Rx VCO with Fast Switching Auto-Band Selection," Radio and Wireless Conference, 2002, RAWCON 2002, IEEE Aug. 11-14, 2002, pp. 209-212.
T.-H. Lin and Y.-J. Lai, "Time-Based Frequency Band Selection Method for Phase-Locked Loops," Electronics Letters, vol. 41, Issue 23, Nov. 10, 2005; pp. 1279-1281.

* cited by examiner

*Primary Examiner*—David Mis
(74) *Attorney, Agent, or Firm*—Downs Rachlin Martin PLLC

(57) ABSTRACT

An integrated circuit including a phase-locked loop (PLL) circuit responsive to a voltage controlled oscillator (VCO) frequency band selection circuit that provides automatic frequency band selection in real time to account for run-time variations, such as power supply and temperature variations over time. The PLL includes a charge pump and an LC tank circuit that provides the automatic frequency band selection based on a VCO control voltage signal supplied by the charge pump.

20 Claims, 3 Drawing Sheets

REAL-TIME FREQUENCY BAND SELECTION CIRCUIT FOR USE WITH A VOLTAGE CONTROLLED OSCILLATOR

FIELD OF THE DISCLOSURE

The present disclosure generally relates to the field of voltage controlled oscillators. In particular, the present disclosure is directed to an automated real-time frequency band selection circuit for use with a voltage controlled oscillator.

BACKGROUND

A voltage controlled oscillator (VCO) is one element of a phase-locked loop (PLL) circuit that is used in many applications in integrated circuits, among other. In an integrated circuit, a PLL circuit can be used, e.g., to generate an internal clock signal of a certain frequency from, e.g., a lower frequency reference signal. Because of process variations in an integrated circuit, a VCO in an integrated circuit may require several frequency bands from which its operating frequency is selected. Consequently, an LC (inductor/capacitor) tank circuit for the VCO may be provided that has a fixed set of frequency bands from which to choose at the initial start up of the PLL circuit (e.g., during the power-up sequence). However, when the VCO is operating, power supply voltage variations and temperature variations over time may effect the VCO frequency. For example, if the capacitance of the LC tank circuit changes with temperature the PLL circuit has no mechanism for automatically adjusting its frequency band during operation and, consequently, the PLL circuit may lose its lock status and operate inefficiently, which is not acceptable in many applications.

SUMMARY OF THE DISCLOSURE

In one embodiment, a real-time frequency band selection circuit is provided. The circuit includes a phase-locked loop circuit having a charge pump outputting a control signal during operation of the phase-locked loop circuit; a voltage controlled oscillator responsive to the control signal and to a tuning signal during operation of the phase-locked loop circuit; and a LC tank circuit configured to generate the tuning signal as a function of the control signal and including a control signal monitoring circuitry configured to automatically monitor the control signal and generate an output signal; a controller for automatically generating a band selection signal as a function of the output signal; band sliding circuitry for generating an output voltage in any one of a plurality of bands and configured to select said one of the plurality of bands as a function of the band selection signal; and band determining circuitry responsive to the output voltage so as to create the tuning signal.

In another embodiment, an integrated circuit is provided. The integrated circuit includes a phase-locked loop circuit having a charge pump outputting a control signal during operation of the phase-locked loop circuit; a voltage controlled oscillator responsive to the control signal and to a tuning signal during operation of the phase-locked loop circuit; and a LC tank circuit configured to generate the tuning signal as a function of the control signal. The LC tank circuit includes control signal monitoring circuitry configured to automatically monitor the control signal, the circuitry having a first comparator for comparing the control signal to a high reference voltage and outputting a first digital output signal, and a second comparator for comparing the control signal to a low reference voltage and outputting a second digital output signal. The LC tank circuit further including a controller for automatically generating a band selection signal as a function of the first digital output signal and the second digital output signal; band sliding circuitry for generating an output voltage in any one of a plurality of bands, the circuitry includes a voltage divider comprising a plurality of intermediate voltage nodes for providing differing voltages, and a plurality of switches electrically connected respectively to the plurality of intermediate voltage nodes and responsive to the band selection signal so as to place the output voltage in one of the plurality of bands. The LC tank circuit still further including band determining circuitry responsive to the output voltage so as to create the tuning signal, the circuitry including a first pair of varactors for continuous frequency tuning of the tuning signal in response to the output voltage of the charge pump, and a second pair of varactors for band selection.

In still another embodiment, a method of automatically selecting a frequency band within a phase-locked loop (PLL) during functional operation of the PLL having a lock time is provided. The method includes receiving a voltage control signal from the PLL; monitoring the voltage control signal relative to a range of acceptable values; generating a band selection signal as a function of the voltage control signal and the range of acceptable values; selecting a frequency band as a function of the band selection signal; providing a band update time greater than the lock time of the PLL; and determining an operational frequency band of the PLL in response to the frequency band selected as a function of the band selection signal.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
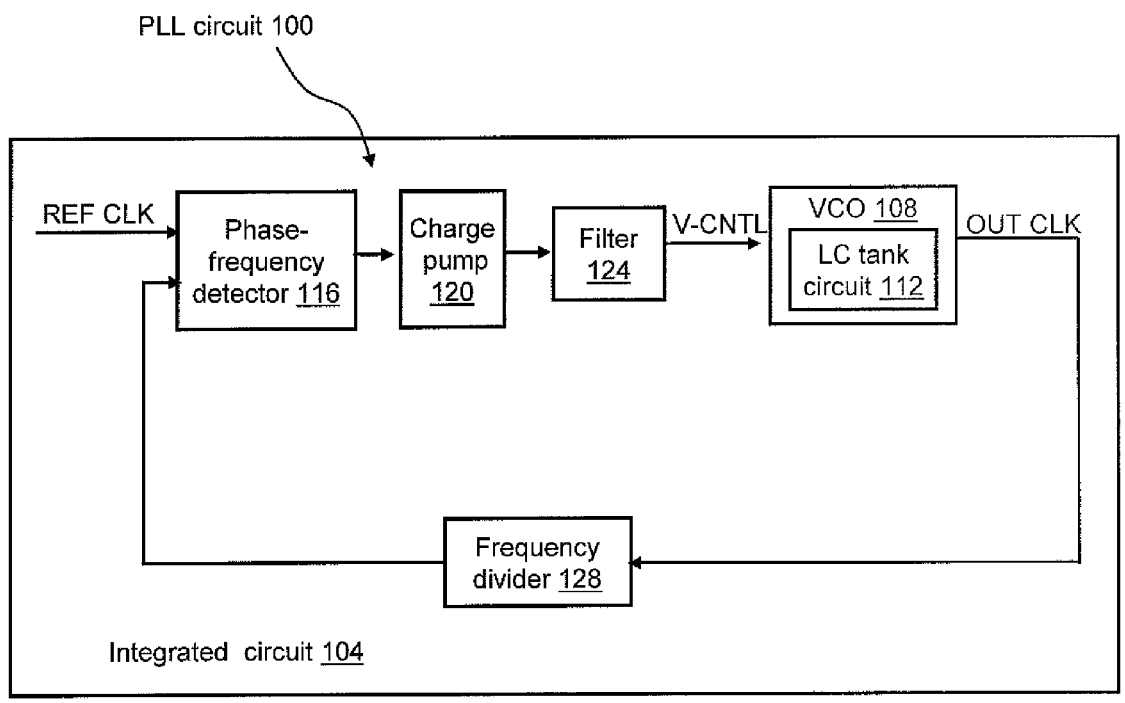
FIG. 1 illustrates a high level block diagram of an example of a PLL circuit in an integrated circuit that includes an LC tank circuit that provides automatic frequency band selection in real time.

Referring now to the drawings, FIG. 1 illustrates a PLL circuit 100 in an integrated circuit 104 that includes a voltage controlled oscillator (VCO) 108 having an LC tank circuit 112 that provides the VCO automatic frequency band selection in real time. LC tank circuit 112 is an important feature of PLL circuit 100 and is described in detail below. However, prior to describing LC tank circuit 112, for the sake of completeness, PLL circuit 100 is first described further. In general, PLL circuit 100 is a closed-loop frequency control circuit that includes a phase-frequency detector 116 having a first input that may be electrically connected to a reference clock signal REF CLK. Additionally, phase-frequency detector 116 has an output that may be electrically connected to an input of a charge pump 120. Charge pump 120 has an output that may be electrically connected to an input of a filter 124. Filter 124 has an output control voltage V-CNTL that may be electrically connected to an input of VCO 108. VCO 108 has an output clock signal OUT CLK that may be electrically connected to an input of a frequency divider 128. Frequency divider 128 has an output that may be electrically connected to a second input of phase-frequency detector 116 and, thereby, closes the loop of PLL circuit 100. Those skilled in the art will be readily familiar with the operation of the various components of PLL circuit 100, except for automatically adjusting LC tank circuit 112, which is a novel aspect of the PLL circuit.

Figure 2:
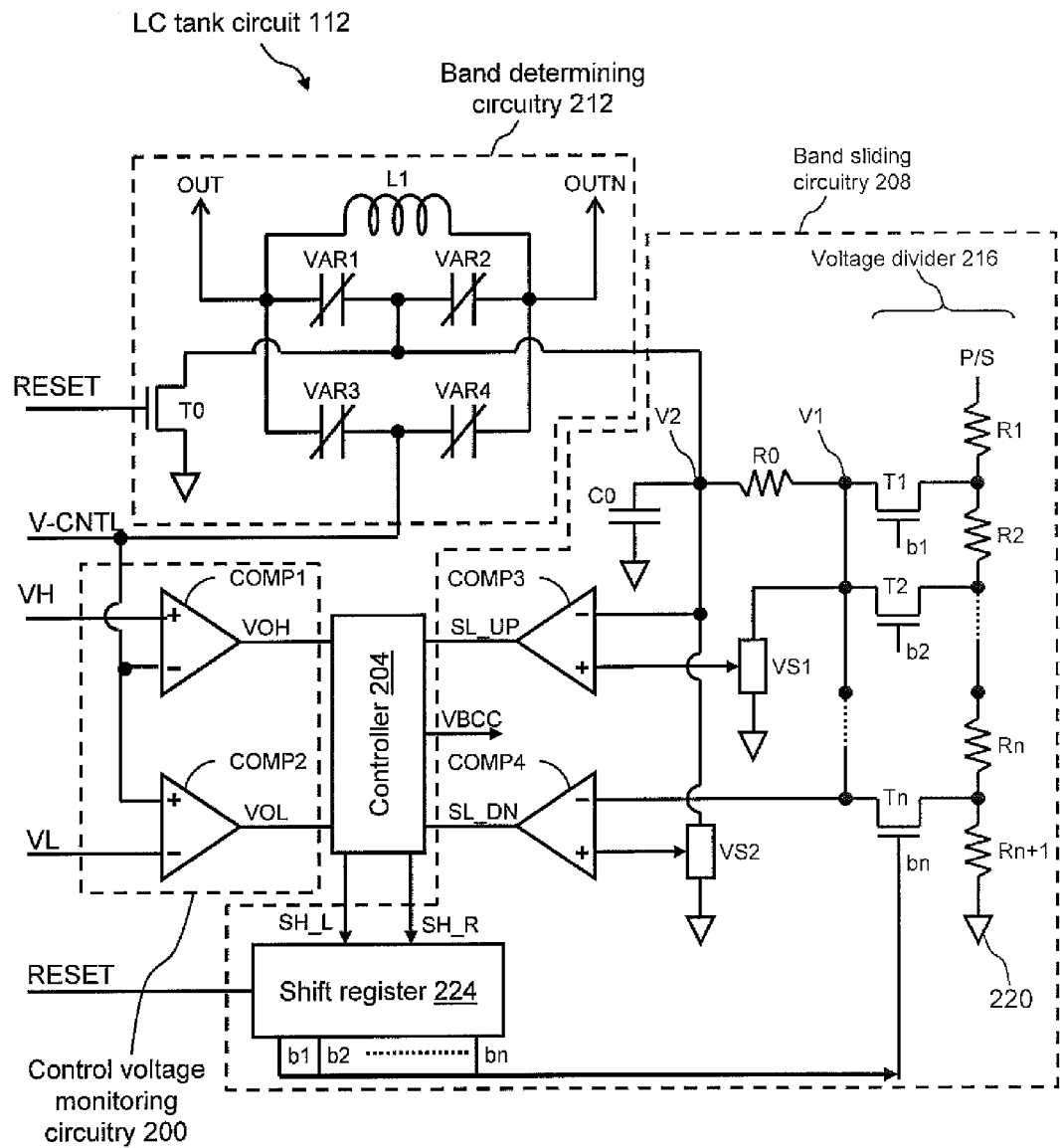
FIG. 2 illustrates a schematic diagram of an example of an LC tank circuit that provides automatic frequency band selection in real time based on a control voltage input.

Attention is now directed to automatically adjusting LC tank circuit 112, which is illustrated in more detail in FIG. 2. At a high level, LC tank circuit 112 provides automatic frequency band selection in real time based on a control voltage V-CNTL. More particularly, an optimal voltage range of voltage V-CNTL is predetermined, and circuitry within LC tank circuit 112 automatically selects one of multiple frequency bands of the LC tank circuit on-the-fly depending on the value of voltage V-CNTL, which may vary over time due to temperature and/or power supply variations. When the voltage V-CNTL approaches the limits of a predetermined voltage window, a calibration operation is automatically initiated in order to shift the VCO 108 (FIG. 1) to a frequency band of higher or lower frequency coverage until an optimal frequency band is reached. In doing so, it is ensured that VCO 108 and, thus, PLL circuit 100 (FIG. 1), is operating at optimal efficiency regardless of temperature variations and/or power supply variations over time.

Referring to FIG. 2, LC tank circuit 112 may be considered to include control voltage monitoring circuitry 200 for monitoring control voltage V-CNTL during operation. The output of control voltage monitoring circuitry 200 is provided to a controller 204, which converts the output of the control voltage monitoring circuit to a frequency band control signal (SH_L, SH_R). LC tank circuit 112 also includes band sliding circuitry 208 and band determining circuitry 212. Band sliding circuitry 208 is responsive to the frequency band control signal to shift the selected frequency band of the LC tank circuit and provides a time period for band update much greater than the lock time of PLL circuit 100 (FIG. 1). Band determining circuitry 212 is responsive to the output of band sliding circuitry and determines the operational frequency band of PLL circuit 100 (FIG. 1). Examples of each of control voltage monitoring circuitry 200, controller 204, band sliding circuitry 208 and band determining circuitry 212 are described in detail below.

Band determining circuitry 212 may include and arrangement of four varactors VAR1, VAR2, VAR3, VAR4, and an inductor L1 that are electrically connected as shown in FIG. 2. Each varactor may be a semiconductor diode whose capacitance changes in order to match an applied voltage. Varactors VAR3, VAR4 are used for continuous frequency tuning and their capacitance changes as a function of voltage V-CNTL of filter 124 (FIG. 1). Varactors VAR1, VAR2 are used for the VCO frequency band selection instead of the fixed capacitors of conventional LC tank circuits. The capacitance of varactors VAR1, VAR2 changes as a function of a control voltage V2, which is a voltage on a capacitor C0 of band sliding circuitry 208. When the voltage on capacitor C0, e.g., V2, increases, the capacitances of varactors VAR1, VAR2 decreases for high frequency bands. Conversely, when the voltage on capacitor C0, e.g., V2, decreases, the capacitances of varactors VAR1, VAR2 increases for low frequency bands. The frequency output of LC tank circuit 112 (FIG. 1) is differential output tuning signals OUT and OUTN of VCO 108 (FIG. 1). Because of the inherent nature of a PLL circuit, as the frequency at tuning signals OUT and OUTN changes, the voltage V-CNTL changes due to the response of charge pump 120 (FIG. 1) in response to phase-frequency detector 116 (FIG. 1) and, thereby, a locked status is maintained.

Band sliding circuitry may further include a voltage divider 216 that is formed between a power supply P/S and ground 220 by a set of serially connected resistors R1, R2 . . . Rn by which different voltage values are provided at a voltage node V1. Additionally, a resistor R0 is connected between voltage node V1 and voltage node V2. In one example, the node connecting resistor Rn and Rn+1 provides the smallest fraction of the voltage of power supply P/S at voltage V1 and the node connecting resistor R1 and R2 provides the largest fraction of the voltage of the power supply at voltage V1. Resistors R1, R2 . . . Rn have a set of associated switches, such as a set of field-effect transistors (FETS) T1, T2 . . . Tn, which are used to select the voltage that is applied across capacitor C0, i.e., control voltage V2 that is connected to varactors VAR1, VAR2 for the VCO frequency band selections. Only one of transistors T1, T2 . . . Tn is turned on at a time under the control of an associated set of gate-select bits b1, b2 . . . bn. In one example, when gate-select bit b1 is at logic high, transistor T1 is turned on, and the largest fraction of the voltage of power supply P/S is provided at voltage node V2 and, thus, the highest frequency band is selected. In another example, when gate-selection bit bn is at logic high, transistor Tn is turned on, and the smallest fraction of the voltage of power supply P/S is provided at voltage node V2 and, thus, the lowest frequency band is selected.

The combination of resistor R0, which is connected between voltage V1 and voltage V2, and the capacitor C0 form a sliding filter within which the time constant is much larger than the PLL locking time. In one example, the time constant of the sliding filter that is formed by resistor R0 and capacitor C0 may be five times that of the locking time of PLL circuit 100 (FIG. 1). When the VCO band is to be changed during the time that PLL circuit 100 (FIG. 1) is in the locked status, voltage V2 on varactors VAR1, VAR2 changes very slow so that the PLL circuit has sufficient time to adjust the VCO control voltage (e.g., voltage V-CNTL of charge pump 120 (FIG. 1)), thereby holding PLL circuit 100 (FIG. 1) in the locked status.

Control voltage monitoring circuitry 200 may include a first comparator COMP1 and a second comparator COMP2, which are voltage comparators used to detect whether the VCO control voltage V-CNTL is within a predetermined normal voltage window. VCO control voltage V-CNTL may be connected to a negative input of comparator COMP1 and a positive input of comparator COMP2. A high reference voltage VH may be connected to a positive input of comparator COMP1 and a low reference voltage VL may be connected to a negative input of comparator COMP2. In one example, high reference voltage VH may be the predetermined normal upper limit threshold voltage of comparator COMP1 and low reference voltage VL may be the predetermined normal lower limit threshold voltage of comparator COMP2. When VCO control voltage V-CNTL is within the window, PLL circuit 100 (FIG. 1) is in the locked status and the VCO frequency band is selected correctly.

When VCO control voltage V-CNTL is higher than high reference voltage VH, a digital output signal VOH of comparator COMP1 is at logic low, which indicates that the VCO frequency band selected has frequency coverage that is too low and, consequently, a "slide up" procedure is needed. When VCO control voltage V-CNTL increases and reaches a level that is greater than the high reference voltage VH, output signal VOH of comparator COMP1 transitions from logic high to logic low in order to invoke an increase in voltage V2 at varactors VAR1, VAR2. By contrast, when VCO control voltage V-CNTL is lower than low reference voltage VL, a digital output signal VOL of comparator COMP2 is at logic low, which indicates the VCO frequency band that is selected has frequency coverage that is too high and, consequently, a "slide down" procedure is needed. When VCO control voltage V-CNTL decreases and reaches a level less than low reference voltage VL, output signal VOL of comparator COMP2 transitions from logic high to logic low in order to invoke a decrease in voltage V2 at varactors VAR1, VAR2.

Band sliding circuitry 208 may further include a shift register 224, which may be an n-bit shift register that generates gate-select bits b1, b2 . . . bn, which, again, control the on/off status of transistors T1, T2 . . . Tn, respectively. Since only one transistor of T1, T2, . . . Tn is allowed to be turned ON, only one bit of b1, b2, . . . bn is at logic high at the same time. The active one of logic high gate-select bit may be shifted right (e.g., toward gate-select bit bn) or left (e.g., toward gate-select bit b1) under the control of a shift-right signal (SH_R) and a shift-left signal (SH_L) that are generated by controller 204. When a positive pulse appears on shift-right signal SH_R, the active one of logic high gate-select bit is shifted one bit toward gate-select bit bn and when a positive pulse appears on shift-low signal SH_L, the active one of logic high gate-select bit is shifted one bit toward gate-select bit b1. In this example, a left shift of shift register 224 increases the voltage V2 at varactors VAR1, VAR2, in order to approach a high-frequency coverage band. By contrast, a right shift of shift register 224 decreases voltage V2 at varactors VAR1, VAR2, in order to approach a low-frequency coverage band.

Band sliding circuitry 208 may further include a third comparator COMP3 and a fourth comparator COMP4, which in this example are voltage comparators. Voltage V2, which, again, is the voltage of capacitor C0, may be connected to a negative input of comparator COMP3 and an output of a first voltage divider VS1 may be connected to a positive input of comparator COMP3. Voltage V1, which is the voltage of voltage divider 216, may be connected to a negative input of comparator COMP4 and an output of a second voltage divider VS2 may be connected to a positive input of comparator COMP4. VS1, VS2 are voltage dividers that may have a ratio K of about 0.8 to 0.9. When a higher frequency band is selected, voltage V1 increases and a digital slide-up output signal SL_UP of comparator COMP3 goes to a logic high, which initiates a slide up procedure.

During the slide up procedure, voltage V2 increases because of the charge current through resistor R0. When voltage V2 reaches K×voltage V1, slide-up output signal SL_UP of comparator COMP3 transitions from a logic high to a logic low, which indicates that the slide up procedure is complete. The transition signal is used to initiate a logic status check (via controller 204) of low reference voltage signal VOL of comparator COMP2. If the output signal VOL of comparator COMP2 is a logic high, VCO control voltage V-CNTL is within the predetermined desired voltage window and the calibration operation is complete. However, if the output signal VOL of comparator COMP2 is a logic low, another slide up procedure is initiated, and so on until VCO control voltage V-CNTL is within the predetermined desired voltage window.

When a slide down procedure is initiated, voltage V1 decreases and slide-down output signal SL_DN of comparator COMP4 transitions from a logic low to a logic high, which initiates a slide down procedure. Capacitor C0 is then discharged through resistor R0 and voltage V2 decreases. When voltage V2×K falls to voltage V1, slide-down output signal SL_DN of comparator COMP4 transitions from a logic high to a logic low, which indicates that the slide down procedure is complete. The transition signal is used to initiate a logic status check (via controller 204) of the output signal VOH of comparator COMP1. If the output signal VOH of comparator COMP1 is a logic high, VCO control voltage V-CNTL is within the predetermined desired voltage window and the calibration operation is complete. However, if the output signal VOH of comparator COMP1 is a logic low, another slide down procedure is initiated, and so on until VCO control voltage V-CNTL is within the predetermined desired voltage window.

Figure 3:
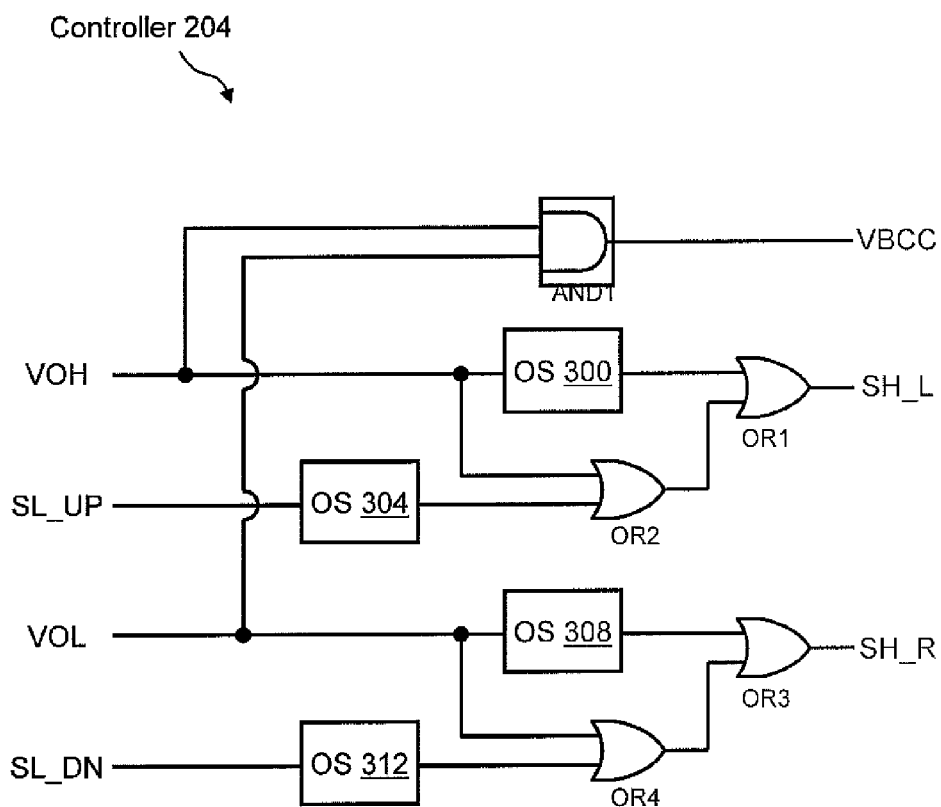
FIG. 3 illustrates a schematic diagram of an example controller circuit for use with an LC tank circuit that provides automatic frequency band selection in real time based on a control voltage input.

FIG. 3 illustrates a schematic diagram of controller 204, which is an example controller circuit for use with an LC tank circuit, such as LC tank circuit 112 of FIG. 2, that provides automatic frequency band selection in real time based on a control voltage input, such as VCO control voltage V-CNTL that is generated by charge pump 120 (FIG. 1). Controller 204 may include a plurality of one-shot generators, such as one-shot generators (OS) OS 300, OS 304, OS 308, OS 312. When a one-shot generator circuit senses a signal transition at its input it generates one instance of pulse of a certain pulse width at its output. In one example, when one-shot generators OS 300, OS 304, OS 308, OS 312 sense an input signal transition from a logic high to a logic low they generate one instance of a positive output pulse of a certain pulse width. Additionally, output signal VOH of comparator COMP1 feeds the input of OS 300, slide-up output signal SL_UP of comparator COMP3 feeds the input of OS 304, output signal VOL of comparator COMP2 feeds the input of OS 308, and slide-down output signal SL_DN of comparator COMP4 feeds the input of OS 312.

Controller 204 may further include an arrangement of logic gates, such as OR gates OR1, OR2, OR3, OR4 and an AND gate AND1, that may be electrically connected with one-shot generators OS 300, OS 304, OS 308, OS 312 as shown in FIG. 3. An output of OR gate OR1 provides shift-left signal SH_L to shift register 224 and an output of OR gate OR3 provides shift-right signal SH_R to shift register 224.

Still referring to FIG. 3, and also to FIG. 2, when output signal VOH of comparator COMP1 transitions from logic high to logic low, which indicates that the VCO frequency band that is selected has frequency coverage that is too low, one-shot generator OS 300 generates a positive narrow pulse that passes through OR gate OR1 and becomes the positive pulse of shift-left signal SH_L to shift register 224, which initiates a slide up procedure that increases voltage V2 at VAR1, VAR2 such that a new VCO frequency band that has higher frequency coverage is selected.

When the slide up procedure is completed, slide-up output signal SL_UP of comparator COMP3 transitions from logic high to logic low and one-shot generator OS 304 generates a positive narrow pulse. If VCO control voltage V-CNTL is already within the predetermined voltage window defined by high and low reference voltages VH, VL, output signal VOH of comparator COMP1 is a logic high and the narrow pulse from one-shot generator OS 304 is blocked at OR gate OR2. However, if VCO control voltage V-CNTL is above high reference voltage VH at comparator COMP1, output signal VOH of comparator COMP1 is a logic low and the pulse from one-shot generator OS 304 passes through OR gates OR2 and OR1 and provide shift-left signal SH_L to shift register 224, which initiates the next slide up procedure.

When output signal VOL of comparator COMP2 drops from logic high to logic low, which indicates that the VCO band selected has frequency coverage that is too high, one-shot generator OS 308 generates a positive narrow pulse which passes through OR gate OR3 and provides shift-right signal SH_R to shift register 224, which initiates a slide down procedure that decreases voltage V2 at varactors VAR1, VAR2, such that a new VCO frequency band having lower frequency coverage is selected.

When the slide down procedure is completed, slide-down output signal SL_DN of comparator COMP4 transitions from logic high to logic low and one-shot generator OS 308 generates a positive narrow pulse. If VCO control voltage V-CNTL is already within the predetermined voltage window defined by high and low reference voltages VH, VL, output signal VOL of comparator COMP2 is a logic high and the narrow pulse from one-shot generator OS 308 is blocked at OR gate OR4. However, if VCO control voltage V-CNTL is below low reference voltage VL at comparator COMP2, output signal VOL of comparator COMP2 is a logic low and the pulse from one-shot generator OS 308 passes through OR gates OR4 and OR3 and provides shift-right signal SH_R to shift register 224, which initiates the next slide down procedure.

The above-described procedure is repeated until VCO control voltage V-CNTL is within the predetermined voltage window that is defined by high and low reference voltages VH, VL and both output signal VOH of comparator COMP1 and output signal VOL of comparator COMP2 are a logic high. A status signal VBCC is provided via AND gate AND1 that indicates when LC tank circuit 112 is at equilibrium. In one example, status signal VBCC is a logic high when LC tank circuit 112 is at equilibrium.

Referring again to FIGS. 1, 2, and 3, the operation of PLL circuit 100 may be as follows. When the PLL circuit 100 is powered up, a powered on reset signal RESET is provided that presets the output of shift register 224 to a known state. In one example, reset signal RESET which is a positive pulse presets the output of shift register 224 such at gate-select bit bn is set to logic high. Additionally, reset signal RESET may be connected to the gate of N type MOSFET T0 in Block 212 of FIG. 2. During the power on reset, the signal RESET turns on T0 and forces voltage V2 to about 0.0 volts by discharging capacitor C0 through T0.

After reset signal RESET has been ended, PLL circuit 100 starts the closed loop operation that produces a locked status, and capacitor C0 is charged by voltage V1 and voltage V2 increases. Since the time constant of R0C0 is much longer than the PLL locking time, the PLL should be in the locked status before V2 reaches K×V1 if a correct band is selected. When voltage V2 reaches K×voltage V1, comparator COMP3 generates a negative transition on its slide-up output signal SL_UP, which initiates a check (via controller 204) of the logic status of output signal VOH of comparator COMP1. If output signal VOH of comparator COMP1 is at logic high, which indicates PLL circuit 100 is in the locked status, the VCO frequency band is selected correctly and no corrective action is needed. However, if output signal VOH of comparator COMP1 is at logic low, another slide up procedure is required and shift-left signal SH_L is issued to shift register 224 and a next slide up procedure is initiated. The slide up procedure is repeated until output signal VOH of comparator COMP1 becomes logic high, which indicates that the VCO frequency band calibration is complete and, thus, status signal VBCC is set to logic high.

During normal operation of PLL circuit 100 in a locked status, the voltage V-CNTL may drift outside of the window defined by high and low reference voltages VH, VL, e.g., due to power supply voltage and/or the temperature variations. Consequently, LC tank circuit 112 automatically initiates a calibration operation of PLL circuit 100 as follows. If VCO control voltage V-CNTL is above high reference voltage VH, a transition from logic high to logic low occurs on output signal VOH of comparator COMP1, controller 204 issues a shift-left signal SH_L to shift register 224, which initiates a slide up procedure that shifts VCO 108 to the frequency band of the higher frequency coverage than the currently selected band. When the slide up procedure is completed, slide-up output signal SL_UP of controller 204 transitions from logic high to logic low, which initiates a check (via the controller) of whether output signal VOH of COMP1 is a logic high. If yes, the calibration operation is completed and status signal VBCC is set to logic high. If not, a next slide up procedure is initiated. The slide up procedure is repeated until VCO control voltage V-CNTL is within the window defined by high and low reference voltages VH, VL and, thus, the calibration operation is completed and status signal VBCC is set to logic high.

If VCO control voltage V-CNTL is below low reference voltage VL, output signal VOL of comparator COMP2 transitions from logic high to logic low, controller 204 issues a shift-right signal SH_R to shift register 224, which initiates a slide down procedure that shifts VCO 108 to the frequency band of lower frequency coverage than the currently selected band. When the slide down procedure is completed, slide-down output signal SL_DN of comparator COMP4 transitions from logic high to logic low, which initiates a check (via controller 204) of whether output signal VOL of comparator COMP2 is a logic high. If yes, the calibration operation is completed and status signal VBCC is set to logic high. If no, a next slide down procedure is initiated. The slide down procedure is repeated until VCO control voltage V-CNTL is within the window defined by high and low reference voltages VH, VL, and, thus, the calibration operation is completed and status signal VBCC is set to logic high.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit, comprising:
 a phase-locked loop circuit that includes:
  a charge pump outputting a control signal during operation of said phase-locked loop circuit;
  a voltage controlled oscillator responsive to said control signal and to a tuning signal during operation of said phase-locked loop circuit; and
  an LC tank circuit configured to generate said tuning signal as a function of said control signal, said LC tank circuit including:
   control signal monitoring circuitry configured to automatically monitor said control signal and generate an output signal;
   a controller for automatically generating a band selection signal as a function of said output signal;
   band sliding circuitry for generating an output voltage in any one of a plurality of bands, said band sliding circuitry being configured to select said one of said plurality of bands as a function of said band selection signal; and
   band determining circuitry responsive to said output voltage so as to create said tuning signal.

2. The integrated circuit of claim 1, wherein said control signal monitoring circuitry includes:
 a first comparator for comparing said control signal to a high reference voltage and outputting a first digital output signal; and
 a second comparator for comparing said control signal to a low reference voltage and outputting a second digital output signal.

3. The integrated circuit of claim 2, wherein said controller generates said band selection signal as a function of said first digital output signal and said second digital output signal.

4. The integrated circuit of claim 3, wherein said band sliding circuitry includes:
 a third comparator for comparing said output voltage to a first reference voltage and outputting a digital slide-up signal; and a fourth comparator for comparing said output to a second reference voltage and outputting a digital slide-down signal.

5. The integrated circuit of claim 4, wherein said controller generates said band section signal as a function of said first digital output signal, said second digital output signal, said digital slide-up signal and said digital slide-down signal.

6. The integrated circuit of claim 1, wherein said band sliding circuitry includes:
   a voltage divider comprising a plurality of intermediate voltage nodes for providing differing voltages; and
   a plurality of switches electrically connected respectively to said plurality of intermediate voltage nodes, said plurality of switches responsive to said band selection signal so as to place said output voltage in said one of said plurality of bands.

7. The integrated circuit of claim 1, wherein said band sliding circuitry includes a sliding filter for controlling said output voltage.

8. The integrated circuit of claim 1, wherein said band sliding circuitry includes:
   a third comparator for comparing said output voltage to a first reference voltage and outputting a digital slide-up signal; and
   a fourth comparator or comparing said output to a second reference voltage and outputting a digital slide-down signal.

9. The integrated circuit of claim 8, wherein said controller generates said band selection signal as a function of said digital slide-up signal and said digital slide-down signal.

10. The integrated circuit of claim 1, wherein said band sliding circuitry includes a shift register for generating a plurality of band-select bits in response to said band selection signal.

11. The integrated circuit of claim 10, wherein said band selection signal includes a shift-left signal and a shift right signal.

12. The integrated circuit of claim 1, wherein said band determining circuitry includes a first pair of varactors for continuous frequency tuning of said tuning signal in response to said output voltage of said band sliding circuitry.

13. The integrated circuit of claim 12, wherein said band determining circuitry further includes a second pair of varactors for band selection.

14. An integrated circuit, comprising:
   a phase-locked loop circuit that includes:
      a charge pump outputting a control signal during operation of said phase-locked loop circuit;
      a voltage controlled oscillator responsive to said control signal and to a tuning signal during operation of said phase-locked loop circuit; and
      an LC tank circuit configured to generate said tuning signal as a function of said control signal, said LC tank circuit including:
         control signal monitoring circuitry configured to automatically monitor said control signal, said control signal monitoring circuitry including:
            a first comparator for comparing said control signal to a high reference voltage and outputting a first digital output signal; and
            a second comparator for comparing said control signal to a low reference voltage and outputting a second digital output signal;
         a controller for automatically generating a band selection signal as a function of said first digital output signal and said second digital output signal;
         band sliding circuitry for generating an output voltage in any one of a plurality of bands, said band sliding circuitry including:
            a voltage divider comprising a plurality of intermediate voltage nodes for providing differing voltages; and
            a plurality of switches electrically connected respectively to said plurality of intermediate voltage nodes, said plurality of switches responsive to said band selection signal so as to place said output voltage in said one of said plurality of bands; and
         band determining circuitry responsive to said output voltage so as to create said tuning signal, said band determining circuitry including:
            a first pair of varactors for continuous frequency tuning of said tuning signal in response to said output voltage of said charge pump; and
            a second pair of varactors for band selection.

15. The integrated circuit of claim 14, wherein said band sliding circuitry includes:
   a third comparator for comparing said output voltage to a first reference voltage and outputting a digital slide-up signal; and
   a fourth comparator for comparing said output to a second reference voltage and outputting a digital slide-down signal.

16. The integrated circuit of claim 15, wherein said controller generates said band section signal as a function of said first digital output signal, said second digital output signal, said digital slide-up signal and said digital slide-down signal.

17. The integrated circuit of claim 14, wherein said band sliding circuitry includes a sliding filter for controlling said output voltage.

18. The integrated circuit of claim 14, wherein said band sliding circuitry includes a shift register for generating a plurality of band-select bits in response to said band selection signal, said plurality of band-select bits corresponding respectively to said plurality of switches.

19. The integrated circuit of claim 18, wherein said band selection signal includes a shift-left signal and a shift right signal.

20. A method of automatically selecting a frequency band within a phase-locked loop (PLL) during functional operation of the PLL, the PLL having a lock time, comprising:
   receiving a voltage control signal from the PLL;
   monitoring said voltage control signal relative to a range of acceptable values;
   generating a band selection signal as a function of said voltage control signal and said range of acceptable values;
   selecting a frequency band as a function of said band selection signal;
   providing a band update time greater than the lock time of the PLL; and
   determining an operational frequency band of the PLL in response to said frequency band selected as a function of said band selection signal.

* * * * *